US012332625B2

(12) United States Patent
Guo et al.

(10) Patent No.: US 12,332,625 B2
(45) Date of Patent: Jun. 17, 2025

(54) METHOD AND APPARATUS FOR CORRECTING POSITION OF WAFER AND STORAGE MEDIUM

(71) Applicant: CHANGXIN MEMORY TECHNOLOGIES, INC., Hefei (CN)

(72) Inventors: Zhiling Guo, Hefei (CN); Haoyu Chen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 895 days.

(21) Appl. No.: 17/487,891

(22) Filed: Sep. 28, 2021

(65) Prior Publication Data

US 2022/0091575 A1    Mar. 24, 2022

Related U.S. Application Data

(63) Continuation of application No. PCT/CN2021/100005, filed on Jun. 15, 2021.

(30) Foreign Application Priority Data

Sep. 21, 2020 (CN) .......................... 202010997317.2

(51) Int. Cl.
*H01L 21/68* (2006.01)
*G05B 19/402* (2006.01)
(Continued)

(52) U.S. Cl.
CPC ......... *G05B 19/402* (2013.01); *G08B 21/182* (2013.01); *H01L 21/67253* (2013.01); *H01L 21/68* (2013.01); *G05B 2219/45031* (2013.01)

(58) Field of Classification Search
None
See application file for complete search history.

(56) References Cited

U.S. PATENT DOCUMENTS

2007/0037301 A1    2/2007    Jekauc
2014/0145741 A1    5/2014    Nakata et al.
(Continued)

FOREIGN PATENT DOCUMENTS

CN    103065943 A    4/2013
CN    103681427 A    3/2014
(Continued)

OTHER PUBLICATIONS

State Intellectual Property Office of the People's Republic of China, Office Action and Search Report Issued in Application No. 202010997317.2, Sep. 9, 2024, 9 pages.
(Continued)

*Primary Examiner* — Shamim Ahmed
(74) *Attorney, Agent, or Firm* — Kilpatrick Townsend & Stockton LLP

(57) ABSTRACT

The present application provides a method and apparatus for correcting the position of a wafer and a storage medium. The method includes: acquiring etching parameters of preset points on an etched first wafer, wherein the etching parameters include positional information and an etch rate; determining the positional information of the central point of an etch rate distribution map of the first wafer according to the etching parameters of the preset points; and correcting the position of a second wafer to be etched according to the positional information of the central point of the etch rate distribution map of the first wafer, so that the circle center of the second wafer coincides with the central point of the etch rate distribution map of the first wafer.

18 Claims, 6 Drawing Sheets

Acquire etching parameters of preset points on an etched first wafer, wherein the etching parameters include positional information and an etch rate — S101

Determine the positional information of the central point of an etch rate distribution map of the first wafer according to the etching parameters of the preset points — S102

Correct the position of a second wafer to be etched according to the positional information of the central point of the etch rate distribution map of the first wafer, so that the circle center of the second wafer coincides with the central point of the etch rate distribution map of the first wafer — S103

(51) Int. Cl.
*G08B 21/18* (2006.01)
*H01L 21/67* (2006.01)

(56) References Cited

U.S. PATENT DOCUMENTS

| 2017/0018438 A1* | 1/2017 | Yanai ................ H01L 21/76802 |
| 2017/0103877 A1* | 4/2017 | Yokota .............. H01L 21/67069 |
| 2017/0285608 A1* | 10/2017 | Sonoda ................ G05B 19/416 |
| 2022/0076968 A1* | 3/2022 | Marumoto ........ H01L 21/67017 |

FOREIGN PATENT DOCUMENTS

| CN | 106444365 A | 2/2017 |
| CN | 103852607 B | 5/2017 |
| CN | 107342254 A | 11/2017 |
| CN | 211086915 U | 7/2020 |
| JP | 2000025938 A | 1/2000 |
| JP | 2000049495 A | 2/2000 |

OTHER PUBLICATIONS

Written Opinion cited PCT/CN2021/100005, mailed on Aug. 17, 2021, 6 pages.
International Search Report as cited in PCT Application No. PCT/CN2021/100005 mailed Aug. 17, 2021, 4 pages.

* cited by examiner

METHOD AND APPARATUS FOR CORRECTING POSITION OF WAFER AND STORAGE MEDIUM

CROSS-REFERENCE TO RELATED APPLICATIONS

The present application is a continuation of International Patent Application No. PCT/CN2021/100005, filed on Jun. 15, 2021, which claims the priority of Chinese Patent Application No. 202010997317.2, entitled "METHOD AND APPARATUS FOR CORRECTING POSITION OF WAFER AND STORAGE MEDIUM", filed with the Patent Office of the People's Republic of China on Sep. 21, 2020. International Patent Application No. PCT/CN2021/100005 and Chinese Patent Application No. 202010997317.2 are incorporated into the present application by reference in their entireties.

TECHNICAL FIELD

The present application relates to the field of semiconductor chip technologies, and in particular, to a method and apparatus for correcting the position of a wafer and a storage medium.

BACKGROUND

In the manufacturing process, semiconductor chips are required to undergo multiple processes, such as wafer fabrication, wafer coating, photolithographic development and etching of wafers, ion implantation and wafer testing, among which etching is a relatively important process. In etching, a plasma etcher (machine for short) is mainly used. During wafer etching, a wafer is transferred into a reaction chamber of the machine by a manipulator of the machine and, after being etched, transferred out by the manipulator. After the machine is subjected to normal troubleshooting or prevention maintenance (PM), on the one hand, the central point of the wafer transferred into the reaction chamber is shifted as a result of a radio-frequency component (RF drawer) in the machine being pulled out, and on the other hand, the position of an upper electrode of the machine is deviated from that before PM as well. These two factors will lead to the shift of the central point of an etch rate (ER) distribution map of the etched wafer, causing deterioration of the homogeneity of etched wafers and a decrease in the yield of products. At this point, the position of the central point of a wafer is required to be corrected in order to ensure the etching effect.

A conventional correction method is as follows: a wafer is first turned over; the wafer which has been turned over is put onto an electrostatic chuck by the manipulator; the position of the manipulator is manually changed to adjust the position of the central point of the wafer to coincide with the position of the central point of the electrostatic chuck, and thereby correction is completed.

The aforementioned method can easily lead to a human error, and takes a long working time of the machine.

SUMMARY

The present application provides a method and apparatus for correcting the position of a wafer and a storage medium in order to automatically correct the position of a wafer and avoid human errors.

In a first aspect, the present application provides a method for correcting the position of a wafer, including:

acquiring etching parameters of preset points on an etched first wafer, the etching parameters including positional information and an etch rate; determining the positional information of the central point of an etch rate distribution map of the first wafer according to the etching parameters of the preset points; and correcting the position of a second wafer to be etched according to the positional information of the central point of the etch rate distribution map of the first wafer, so that the circle center of the second wafer coincides with the central point of the etch rate distribution map of the first wafer.

In a second aspect, the present application provides an apparatus for correcting the position of a wafer, including:

an acquisition module configured for acquiring etching parameters of preset points on an etched first wafer, wherein the etching parameters include positional information and an etch rate;

a determination module configured for determining the positional information of the central point of an etch rate distribution map of the first wafer according to the etching parameters of the preset points; and a correction module configured for correcting the position of a second wafer to be etched according to the positional information of the central point of the etch rate distribution map of the first wafer so that the circle center of the second wafer coincides with the central point of the etch rate distribution map of the first wafer.

In a third aspect, the present application provides a computer-readable storage medium in which a computer program is stored, and when the program is executed by a processor, the steps of the method of the first aspect are carried out.

In a fourth aspect, the present application provides an electronic device, including a memory, a processor and a computer program stored in the memory and capable of running in the processor, and when the program is executed by the processor, the steps of the method of the first aspect are carried out.

In a fifth aspect, the present application provides a computer program, including program codes, and when the computer program is run by a computer, the program codes execute the steps of the method of the first aspect.

In a sixth aspect, the present application provides a computer program product, including a computer program, and when the computer program is executed by a processor, the steps of the method of the first aspect are carried out.

BRIEF DESCRIPTION OF DRAWINGS

In order to more clearly illustrate the technical solutions in the present application or the prior art, the accompanying drawings required to be used in the description of the embodiments or the prior art will be briefly introduced below. Apparently, the accompanying drawings in the following description show merely some embodiments of the present application, and persons of ordinary skill in the art may still derive other drawings from these accompanying drawings without creative efforts.

DESCRIPTION OF EMBODIMENTS

In order to make the objective, technical solution and advantages of the present application clearer, the technical solution in the present application will be clearly and completely described below with reference to the accompanying drawings in the present application. Apparently, the embodiments described are merely part of the embodiments of the present application, rather than all the embodiments. All other embodiments which are obtained by those of ordinary skill in the art based on the embodiments in the present application without creative efforts shall fall within the protection scope of the present application.

Some terms in the embodiments of the present application will be explained first below, so that those skilled in the art can understand them.

Figure 1:
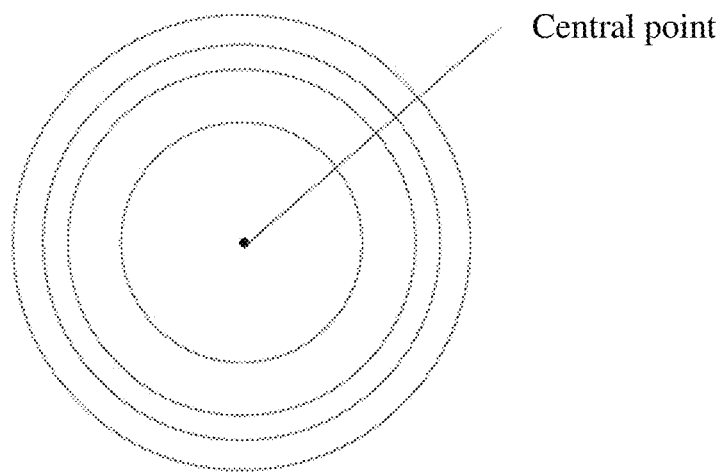
FIG. 1 is an etch rate distribution map of a wafer.

Etch rate distribution map of wafer: After a wafer is etched by a plasma etcher, FIG. 1 is an etch rate distribution map of the wafer, and as shown in FIG. 1, the etch rate of every point on the wafer is distributed in concentric circles, with the etch rates of the points located on the same circle being approximate or equal and the center of the concentric circles being the central point of the etch rate distribution map of the wafer.

In the prior art, in order to implement wafer position correction, the position of the central point of a wafer is adjusted to coincide with the position of the central point of an electrostatic chuck by manually changing the position of a manipulator. However, the manual correction method has very complex steps, can easily lead to a human error, and takes a long working time of the machine.

In order to solve this problem, the present application provides a method and apparatus for correcting the position of a wafer and a storage medium. By acquiring the positional information and etch rates of preset points on an etched wafer and utilizing the principle that the etch rates of the points located on the same circle in an etch rate distribution map of the wafer are approximate or equal, the positional information of the central point of the etch rate distribution map of the etched wafer is determined according to the positional information and etch rates of the preset points, and the position of a wafer to be etched subsequently is then corrected according to the positional information of the central point of the etch rate distribution map, so that the circle center of the wafer to be etched coincides with the central point of the etch rate distribution map of the etched wafer. Thereby, the position of a wafer can be automatically corrected, the problem that the manual correction method can easily lead to a human error and takes a long working time of the machine is avoided, and the accuracy and efficiency of correction are increased.

The specific processes of the method and apparatus for correcting the position of a wafer and the storage medium according to the present application will be illustrated below in detail through specific embodiments.

Figure 2:
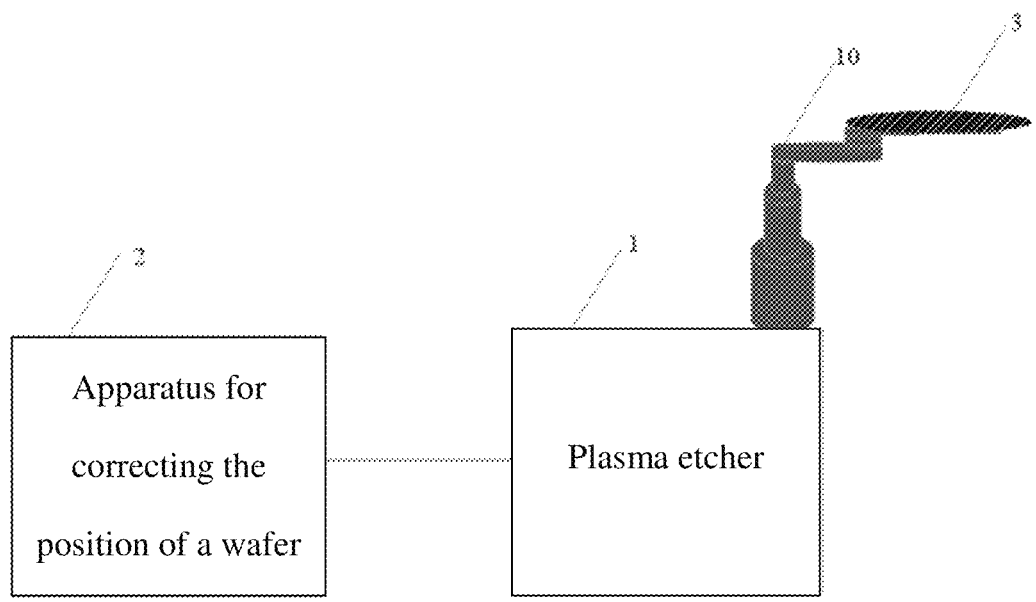
FIG. 2 is a schematic diagram of an application scenario of a method for correcting the position of a wafer according to an embodiment of the present invention.

Exemplarily, FIG. 2 is a schematic diagram of an application scenario of a method for correcting the position of a wafer according to an embodiment of the present invention. As shown in FIG. 2, the apparatuses or devices involved in this application scenario may include a plasma etcher 1 and an apparatus 2 for correcting the position of a wafer. As the plasma etcher 1, other apparatuses capable of etching a wafer may also be used, and the apparatus 2 for correcting the position of a wafer may be disposed on the plasma etcher 1, specifically in the form of a software module or a hardware module. Alternatively, the apparatus 2 for correcting the position of a wafer may be an independent apparatus or device, and, specifically, may be disposed on other apparatuses or devices in the form of a software module or a hardware module, and the device may be an electronic device, such as a computer. In this mode, the apparatus 2 for correcting the position of a wafer and the plasma etcher 1 may be connected in a wired or wireless manner.

The plasma etcher 1 is provided with a manipulator 10, which is configured for transferring a wafer 3 into a reaction chamber of the plasma etcher 1 for etching and, after etching is complete, transferring the wafer out of the reaction chamber.

After the plasma etcher 1 is subjected to normal troubleshooting or prevention maintenance, the central point of the wafer transferred into the reaction chamber is shifted as a result of a radio-frequency component in the plasma etcher 1 being pulled out, and the position of an upper electrode of the plasma etcher 1 is deviated as well.

Both factors will also lead to the shift of the central point of an etch rate distribution map of the wafer subsequent to wafer etching. As a result, some positions of the wafer may not be etched, and the etch rates of the wafer may be unevenly distributed as well.

Figure 3:
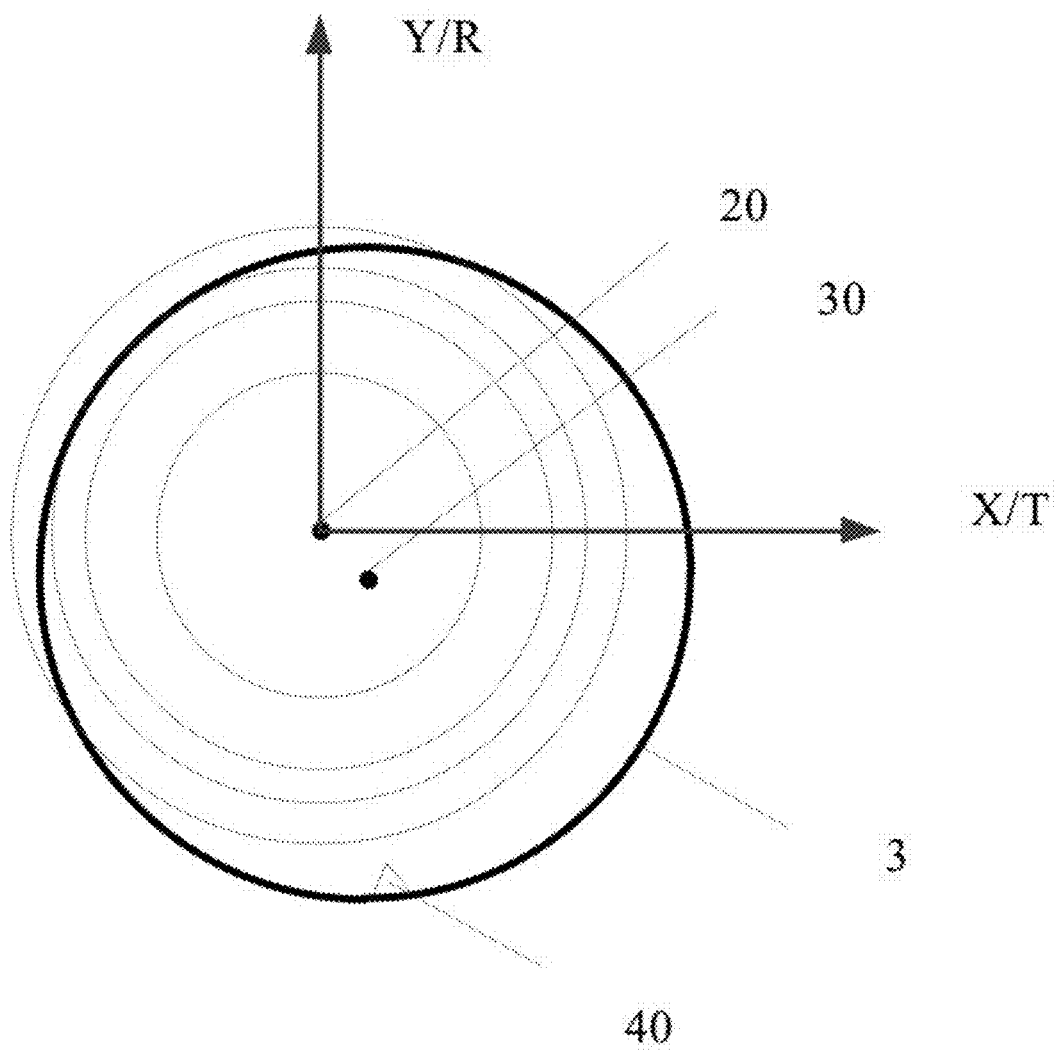
FIG. 3 is a schematic diagram of the central point of a wafer and an etch rate distribution map of the wafer subsequent to the shift of the central point.

FIG. 3 is a schematic diagram of the central point of a wafer and an etch rate distribution map of the wafer subsequent to the shift of the central point. As shown in FIG. 3, a central point (i.e., the circle center) of the wafer 3 is 30, a central point of the etch rate distribution map of the wafer is 20, and a notch point in the wafer is 40. Subsequent to the shift of the central point 30 of the wafer 3, the central point 20 of the etch rate distribution map of the wafer 3 is also shifted after the wafer 3 is etched.

Since the central point 30 of the wafer 3 is not at the same position as the central point 20 of the etch rate distribution map of the wafer 3, some positions of the wafer 3 may not be etched, and the etch rates of the wafer may be unevenly distributed as well. These problems may also exist in the etching of wafers after the wafer 3, leading to the deterioration of the homogeneity of etched wafers and a decrease in the yield of products.

Therefore, it is necessary to correct the position of the central point of a wafer to be etched, so that the position of the central point of the wafer to be etched coincides with the central point of the etch rate distribution map of the etched wafer to ensure the homogeneity of the etched wafers and the yield of products.

In the present application, during specific correction, the apparatus 2 for correcting the position of a wafer acquires the etching parameters of preset points on the etched wafer 3 from the plasma etcher 1, and a method for correcting the position of a wafer according to the present application is then executed to correct the position of the wafer to be etched subsequently.

Specifically, the apparatus 2 for correcting the position of a wafer determines the positional information of the central point of the etch rate distribution map of the wafer 3, and sends the positional information of the central point of the etch rate distribution map of the wafer 3 to the plasma etcher 1. The plasma etcher 1 controls the manipulator 10 to correct the position of the wafer to be etched according to the positional information of the central point of the etch rate distribution map of the wafer 3.

The positional information may include the two-dimensional coordinates (x, y) of the central point 20 of the etch rate distribution map of the wafer 3, or a radius R from the central point 20 of the etch rate distribution map of the wafer 3 relative to the wafer 3 and an angle T of the shifted wafer notch point. The manipulator 10 can correct the wafer to be etched subsequently according to the aforementioned positional information.

Figure 4:
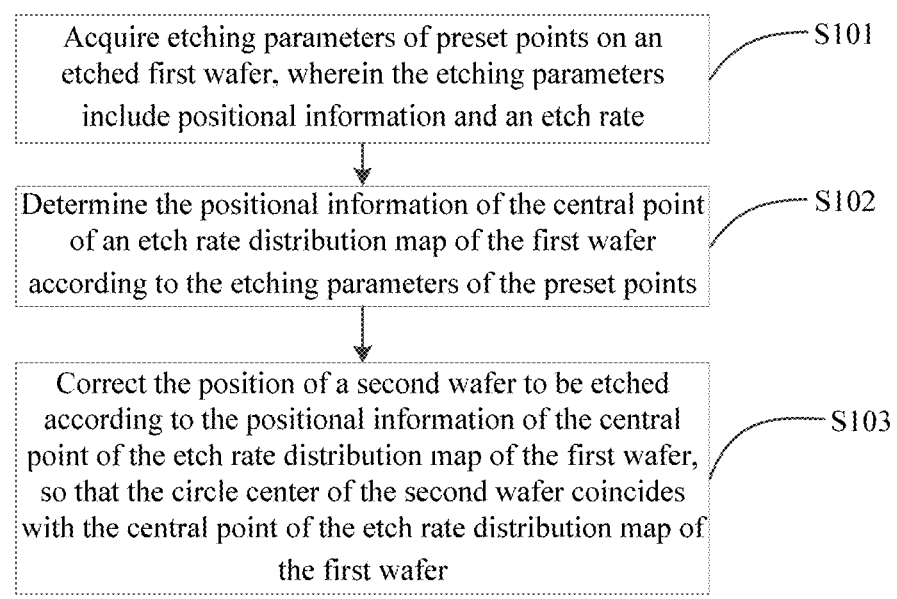
FIG. 4 is a flowchart of a method for correcting the position of a wafer according to an embodiment of the present application.

FIG. 4 is a flowchart of a method for correcting the position of a wafer according to an embodiment of the present application, and an executive body in the present embodiment may be the apparatus for correcting the position of a wafer shown in FIG. 2. As shown in FIG. 4, the method of the present embodiment may include:

(S101) acquiring etching parameters of preset points on an etched first wafer, wherein the etching parameters include positional information and an etch rate.

Specifically, the etching parameters of the preset points on the etched first wafer may be acquired from a plasma etcher or acquired when wafer position correction is required. For example, wafer position correction is required when the central point of the etch rate distribution map of the wafer is shifted after the plasma etcher is subjected to normal troubleshooting or prevention maintenance. The etching parameters may also be periodically acquired according to a preset cycle, so that the position of the wafer can be periodically corrected to ensure the homogeneity of the etched wafers and the yield of products.

Specifically, the positional information of the preset points may be directly acquired from the plasma etcher, while the etch rates of the preset points may be measured with the first wafer, specifically by the plasma etcher, and the plasma etcher can establish a mapping relationship between the measured etch rates of the preset points and the positional information to obtain the etching parameters of the preset points. Further, the obtained etching parameters of the preset points may also be stored so as to be used in subsequent correction.

In the present embodiment, as an implementation, the preset points include a first number of points on each of at least two circles, with the center of each circle being the circle center of the first wafer, the radii of the circles being different and less than or equal to the radius of the first wafer and the first number of points on each circle being evenly distributed. Since the first wafer is an etched wafer, the plasma etcher knows the etching parameters of each point on the first wafer, which include positional information and an etch rate. Because the etch rates of the points located on the same circle in the etch rate distribution map of the wafer are approximate or equal and the points located on the same circle in the etch rate distribution map of the first wafer need to be found out through the preset points in the present embodiment, the preset points include a first number of points on each of the at least two circles, and for example, the first number is M. The at least two circles are concentric circles with the circle center of the first wafer as a circle center, and the M points on each circle are evenly distributed. The at least two circles are circles with a small radius difference in order to find out the points located on the same circle which have approximate or equal etch rates, and for example, the difference between the radii of the at least two circles is within a preset range.

Because the characteristic that the etch rates of the points located on the same circle in the etch rate distribution map of the wafer are approximate or equal is more obvious at the edge of the distribution map, in one implementation, the difference between the radius of each of the at least two circles and the radius of the first wafer is less than or equal to a first threshold, and the first threshold is a small value (e.g. 10 mm), so that the at least two circles are circles located at the edge in the etch rate distribution map of the wafer. For example, the preset points include M=32 points on the two circles, the radius of the outer circle is 150 mm, the radius of the inner circle is 140 mm, and the radius of the first wafer is 150 mm.

In practice, the radii of the circles where the preset points are located may be set in advance according to the radius of a wafer capable of being etched by the plasma etcher. In the present embodiment, since the difference between the radius of each of the at least two circles (i.e., the circles located at the edge in the etch rate distribution map of the wafer) and the radius of the first wafer is less than or equal to the first threshold, the positional information of the central point of the etch rate distribution map of the first wafer is determined according to the etching parameters of the first number of points on each of the at least two circles. Therefore, the accuracy of the determined central point of the etch rate distribution map can be increased.

The positional information may include two-dimensional coordinates of the preset points, or may be the radius of the circle where the preset points are located and an angle of a shifted wafer notch point.

(S102) determining the positional information of the central point of an etch rate distribution map of the first wafer according to the etching parameters of the preset points.

Specifically, according to the positional information and etch rates of the preset points and the principle that the etch rates of the points located on the same circle in the etch rate distribution map of the wafer are approximate or equal, points with approximate or equal etch rates are determined from the preset points, and the central point of the etch rate distribution map of the first wafer is then determined according to these points. Specifically, according to these points, it can be determined that these points are located at the center of a circle, which is the central point of the etch rate distribution map of the first wafer and the positional information (i.e., the positional information of the central point of the etch rate distribution map of the first wafer) of which may be acquired from the plasma etcher.

(S103) correcting the position of a second wafer to be etched according to the positional information of the central point of the etch rate distribution map of the first wafer, so that the circle center of the second wafer coincides with the central point of the etch rate distribution map of the first wafer.

Specifically, according to the positional information of the central point of the etch rate distribution map of the first wafer, the position of the second wafer to be etched may be corrected in two optional modes:

Mode 1: If the apparatus for correcting the position of a wafer is disposed on the plasma etcher, the plasma etcher can directly send the positional information of the central point of the etch rate distribution map of the first wafer to the manipulator shown in FIG. 2. The manipulator corrects the position of the second wafer to be etched according to the positional information of the central point of the etch rate distribution map of the first wafer. Consequently, the circle center of the second wafer coincides with the central point of the etch rate distribution map of the first wafer, completing wafer position correction.

Alternatively, the manipulator shown in FIG. 2 is controlled by the plasma etcher to correct the position of the second wafer to be etched according to the positional information of the central point of the etch rate distribution map of the first wafer, so that the circle center of the second wafer coincides with the central point of the etch rate distribution map of the first wafer, completing wafer position correction.

Mode 2: If the apparatus for correcting the position of a wafer is disposed on another device, the device provided with the apparatus for correcting the position of a wafer sends the positional information of the central point of the etch rate distribution map of the first wafer to the plasma etcher, and the plasma etcher then directly sends the positional information of the central point of the etch rate distribution map of the first wafer to the manipulator shown in FIG. 2.

Alternatively, the manipulator shown in FIG. 2 is controlled by the plasma etcher to correct the position of the second wafer to be etched according to the positional information of the central point of the etch rate distribution map of the first wafer. Consequently, the circle center of the second wafer coincides with the central point of the etch rate distribution map of the first wafer, completing wafer position correction.

Compared with the conventional manual correction method, the method according to the present application not only saves manpower, but also shortens the halt time of the etching machine and avoids human errors and human misoperation, and can accurately correct the position of a wafer in time.

In the present embodiment, since the positional information may include two-dimensional coordinates of the preset points or may be the radius of the circle where the preset points are located and an angle of the shifted wafer notch point, the positional information of the central point of the etch rate distribution map of the first wafer may include two-dimensional coordinates of the central point, or a radius from the central point of the etch rate distribution map of the first wafer relative to the first wafer and an angle of the shifted wafer notch point.

If the positional information of the central point of the etch rate distribution map of the first wafer includes the two-dimensional coordinates of the central point, then the manipulator can directly correct the position of the second wafer to be etched according to the two-dimensional coordinates of the central point. The two-dimensional coordinates may also be converted into a radius from the central point relative to the first wafer and an angle of the shifted wafer notch point, and the position of the second wafer to be etched is then corrected according to the radius from the central point of the etch rate distribution map of the first wafer relative to the first wafer and the angle of the shifted wafer notch point.

If the positional information of the central point of the etch rate distribution map of the first wafer includes the radius from the central point relative to the first wafer and the angle of the shifted wafer notch point, then the manipulator can directly correct the position of the second wafer to be etched according to the radius from the central point of the etch rate distribution map of the first wafer relative to the first wafer and the angle of the shifted wafer notch point.

According to the method for correcting the position of a wafer according to the present embodiment, by acquiring the positional information and etch rates of the preset points on the etched first wafer, the positional information of the central point of the etch rate distribution map of the first wafer is determined according to the positional information and etch rates of the preset points, and the position of the second wafer to be etched is then corrected according to the positional information of the central point of the etch rate distribution map of the first wafer, so that the circle center of the second wafer coincides with the central point of the etch rate distribution map of the first wafer. By utilizing the principle that the etch rates of the points located on the same circle in the etch rate distribution map of the wafer are approximate or equal, the central point of the etch rate distribution map of the first wafer is determined according to the etch rates of the preset points, and the position of the wafer to be etched subsequently is then corrected according to the positional information of the central point of the etch rate distribution map of the first wafer. Thereby, the position of the wafer can be automatically corrected, the problem that the manual correction method can easily lead to a human error and takes a long working time of the machine is avoided, and the accuracy and efficiency of correction are increased.

Figure 5:
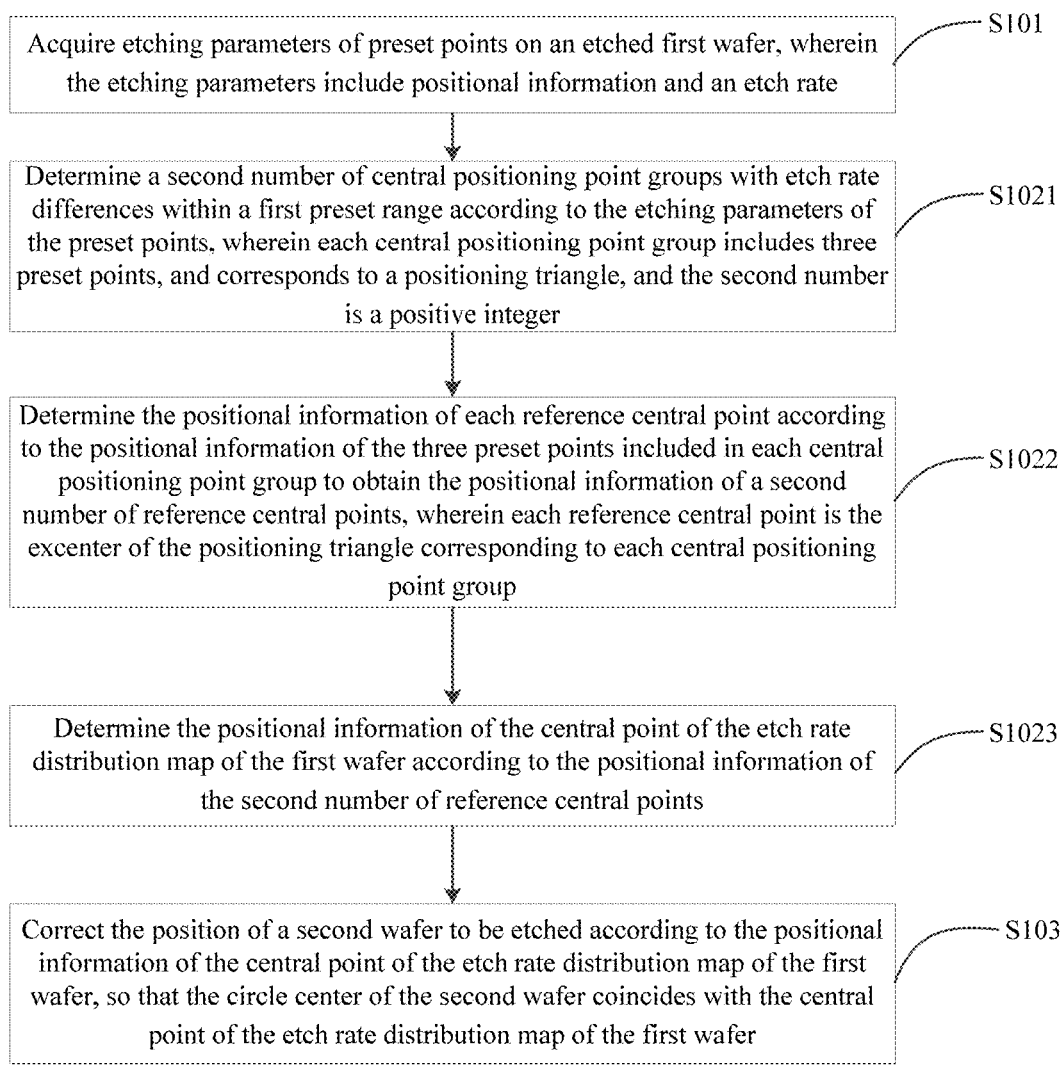
FIG. 5 is a flowchart of a method for correcting the position of a wafer according to an embodiment of the present application.

FIG. 5 is a flowchart of a method for correcting the position of a wafer according to an embodiment of the present application, and the executive body in the present embodiment may be the apparatus for correcting the position of a wafer shown in FIG. 2. As shown in FIG. 5, according to the method of the present embodiment based on the method shown in FIG. 4, optionally, S102 above may be implemented by the following steps:

(S1021) determining a second number of central positioning point groups with etch rate differences within a first preset range according to the etching parameters of the preset points, wherein each central positioning point group includes three preset points, and corresponds to a positioning triangle, and the second number is a positive integer.

Specifically, the second number of central positioning point groups are determined according to the etching parameters of the preset points. For example, the second number is M, each central positioning point group includes three preset points, and the differences of the corresponding etch rates are within the first preset range, which is a range for defining equal or approximate etch rates.

If the first preset range is 0, then the etch rates of the three preset points included in the central positioning point group are equal; and if the first preset range is less than or equal to 0.1, then the etch rates of the three preset points included in the central positioning point group are equal or approximate. Each central positioning point group corresponds to a positioning triangle. That is, the three preset points included in each central positioning point group are preset points which can form a triangle, so the three points can form a triangle when being connected.

(S1022) determining the positional information of each reference central point according to the positional information of the three preset points included in each central positioning point group to obtain the positional information of a second number of reference central points, wherein each reference central point is the excenter of the positioning triangle corresponding to each central positioning point group.

Specifically, according to the positional information of the three preset points included in each central positioning point group, the positional information (i.e., the positional information of each reference central point) of the excenter of the positioning triangle corresponding to the central positioning point group is determined.

When the positional information of the preset points includes two-dimensional coordinates of the preset points, as a calculation method, for example, a central positioning point group includes three preset points A (x1, y1), B (x2, y2) and C (x3, y3), then:

the coordinates of the central point M of a line AB connecting the point A and the point B are:

$$\left(\frac{x1+x2}{2}, \frac{y1+y2}{2}\right).$$

The slope of the line AB is:

$$k = \frac{(y2-y1)}{(x2-x1)}.$$

The slope of the perpendicular bisector of the line AB is: $-1/k$.

Therefore, the perpendicular bisector of the line AB can be obtained by a point-slope form:

$$y = -\frac{(x2-x1)}{(y2-y1)} * \left[x - \frac{x1+x2}{2}\right] + \frac{y1+y2}{2}.$$

Similarly, the perpendicular bisector of the line AC is obtained:

$$y = -\frac{(x3-x1)}{(y3-y1)} * \left[x - \frac{x1+x3}{2}\right] + \frac{y1+y3}{2}.$$

The intersection of the two perpendicular bisectors is the excenter of the positioning triangle corresponding to the central positioning point group, and the positional information of the excenter is the positional information of a reference central point.

As another calculation method, wherein for example, a central positioning point group includes three preset points A (x1, y1), B (x2, y2) and C (x3, y3), and the coordinates of the three preset points A, B and C are put into a formula: x2+y2+Dx+Ey+F=0(D2+E2−4F>0)

Thereby, D, E and F are obtained.

The coordinates of the excenter of the positioning triangle are then determined as (−D/2, −E/2).

In this calculation method, abnormal values can also be eliminated by the radius of a circle of the excenter of the positioning triangle, wherein $$\text{radius} = \frac{\sqrt{D^2 + E^2 - 4F}}{2}.$$

For example, if the calculated radius of the circle of the excenter of the positioning triangle is greater than the radius of the first wafer or the difference between the calculated radius of the circle of the excenter of the positioning triangle and the radius of the first wafer is greater than a preset threshold, then the central positioning point group can be removed.

Figure 6:
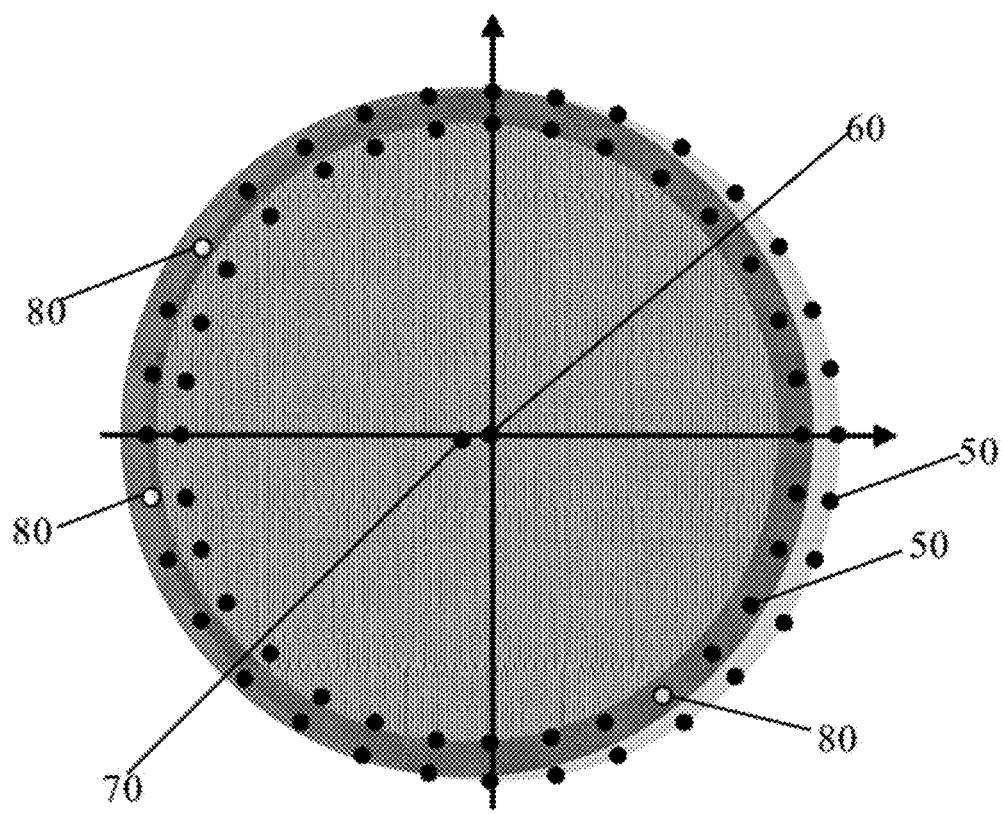
FIG. 6 is a schematic diagram of selecting preset points in the method for correcting the position of a wafer according to the embodiment of the present application.

An example of the process of determining a central positioning point group is given below with reference to FIG. 6. FIG. 6 is a schematic diagram of selecting preset points in the method for correcting the position of a wafer according to the embodiment of the present application. As shown in FIG. 6, preset points are the 32 points on the two circles at the edge of the first wafer. The selected preset points on the first wafer are the 32 points on the two circles at the edge of the first wafer, and each of the two circles at the edge of the first wafer has 32 points 50, which are evenly distributed. A circle center of the first wafer is 60. For example, according to the etching parameters of a total of 64 points on the two circles, the preset points included in a determined central positioning point group are preset points 80 shown in FIG. 6, which are connected to form a positioning triangle, and an excenter 70 of the positioning triangle is a determined reference central point. M reference central points can be determined according to M central positioning point groups, and correspondingly, the positional information of the M reference central points can also be determined.

(S1023) determining the positional information of the central point of the etch rate distribution map of the first wafer according to the positional information of the second number of reference central points.

Specifically, because a plurality of the second number of reference central points are provided, optionally, S1023 may be as follows: determining an offset of each of the second number of reference central points relative to the circle center of the first wafer according to the positional information of the second number of reference central points and the positional information of the circle center of the first wafer to obtain a second number of offsets, wherein the offset of the reference central point relative to the circle center of the first wafer is a distance between both; and then determining the positional information of the point corresponding to the average of the second number of offsets as the positional information of the central point of the etch rate distribution map of the first wafer.

Optionally, the positional information of the second number of reference central points includes two-dimensional coordinates, and optionally, S1023 may also be as follows: converting the positional information of each reference central point from the two-dimensional coordinates into R and T; for example, with the second number as M, calculating an average R of M Rs and an average T' of M Ts'; and determining (R' and T') as the positional information of the central point of the etch rate distribution map of the first wafer.

Further, after the second number of offsets are obtained, the method of the present embodiment may further include: determining the average of the second number of offsets is within a second preset range, i.e., determining whether the offsets are within a reasonable range; and if the average of the second number of offsets is not within the second preset range, sending alarm information. That is, if the offsets are not within the reasonable range, alarm information is sent, so that manual check or adjustment based on an actual condition can be performed.

According to the etching parameters of the preset points, a second number of central positioning point groups with etch rate differences within a first preset range is determined, with each central positioning point group including three preset points and corresponding to a positioning triangle; according to the positional information of the three preset points included in each central positioning point group, the positional information of the excenter of the positioning triangle corresponding to each central positioning point group, i.e., the positional information of each reference central point, is determined; finally, according to the positional information of the second number of reference central points, the positional information of the central point of the etch rate distribution map of the first wafer is determined; and consequently, by determining the positional information of multiple reference central points according to the method of determining the etch rates and the excenters of the triangles and then finally determining the positional information of the central point of the etch rate distribution map of the first wafer according to the positional information of the multiple reference central points, the method for correcting the position of a wafer according to the present embodiment can ensure the accuracy of the determined positional information of the central point of the etch rate distribution map of the first wafer. An accurate correction basis is provided for the automatic correction of the position of the wafer, ensuring the accuracy of correction.

Further, determining the positional information of the central point of the etch rate distribution map of the first wafer according to the positional information of the second number of reference central points in S1023 may also be as follows:

determining a third number of reference central points with the radii of the circles where the third number of reference central points is located within a third preset range and angles of the shifted wafer notch point within a fourth preset range among the second number of reference central points according to the positional information of the second number of reference central points, wherein for example, the third preset range is a radius r of the first wafer plus or minus 100 μm, and the fourth preset range is an angle t of the shifted wafer notch point of the first wafer plus or minus 10°; for example, with the second number as M, determining the third number as Q (less than or equal to M) reference central points according to the positional information of the M reference central points, the third preset range and the fourth preset range, i.e., removing the reference central points with Rs not within the third preset range or Ts not within the fourth preset range among the M reference central points and keeping the Q reference central points with the reasonable offsets, so that the accuracy of the determined central point of the etch rate distribution map of the first wafer can be increased; and then determining the positional information of the central point of the etch rate distribution map of the first wafer according to the positional information of the third number of reference central points. Consequently, by determining the positional information of the central point of the etch rate distribution map of the first wafer according to the positional information of the third number of reference central points with the reasonable offsets, the accuracy of the determined central point of the etch rate distribution map of the first wafer can be increased.

Further, after the positional information of the central point of the etch rate distribution map of the first wafer is determined, a wafer position shift range detected by a central detector of the plasma etcher also needs to be confirmed, and whether the positional information of the central point of the etch rate distribution map of the first wafer is within the wafer position shift range detected by the central detector is required to be judged. If the positional information is within the wafer position shift range, then S103 is executed for correction, or else S103 is not executed for correction. Thereby, the accuracy of wafer position correction can be further increased.

Figure 7:
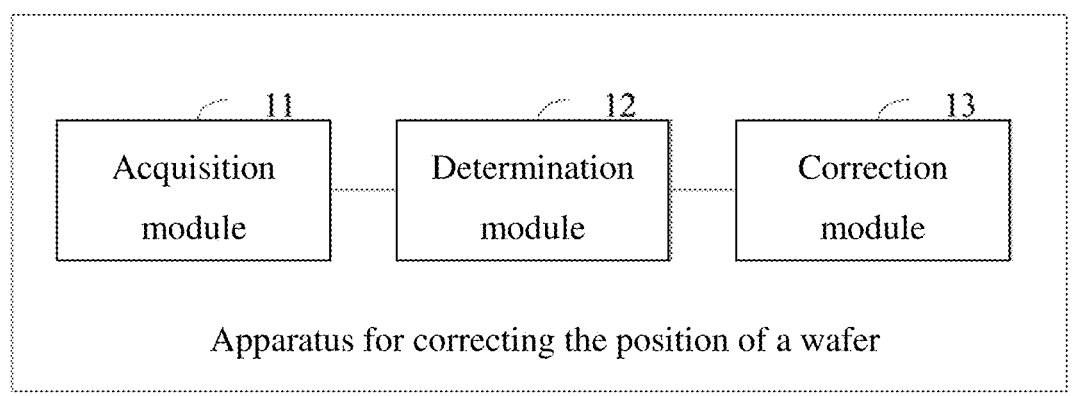
FIG. 7 is a schematic structural diagram of an apparatus for correcting the position of a wafer according to an embodiment of the present application.

FIG. 7 is a schematic structural diagram of an apparatus for correcting the position of a wafer according to an embodiment of the present application. As shown in FIG. 7, the apparatus of the present embodiment may include: an acquisition module 11, a determination module 12 and a correction module 13, wherein the acquisition module 11 is configured for acquiring etching parameters of preset points on an etched first wafer, which include positional information and an etch rate;

the determination module 12 is configured for determining the positional information of the central point of an etch rate distribution map of the first wafer according to the etching parameters of the preset points; and the correction module 13 is configured for correcting the position of a second wafer to be etched according to the positional information of the central point of the etch rate distribution map of the first wafer so that the circle center of the second wafer coincides with the central point of the etch rate distribution map of the first wafer.

Optionally, the preset points include a first number of points on each of at least two circles, with the center of each circle being the circle center of the first wafer, the radii of the circles being different and less than or equal to the radius of the first wafer and the first number of points on each circle being evenly distributed.

Optionally, the difference between the radius of each of the at least two circles and the radius of the first wafer is less than or equal to a first threshold.

Optionally, the positional information includes two-dimensional coordinates, or the radius of the circle where the preset points are located and an angle of a shifted wafer notch point.

Further, the determination module 12 is configured for:

determining a second number of central positioning point groups with etch rate differences within a first preset range according to the etching parameters of the preset points, wherein each central positioning point group includes three preset points, and corresponds to a positioning triangle, and the second number is a positive integer; determining the positional information of each reference central point according to the positional information of the three preset points included in each central positioning point group to obtain the positional information of a second number of reference central points, wherein each reference central point is the excenter of the positioning triangle corresponding to each central positioning point group; and determining the positional information of the central point of the etch rate distribution map of the first wafer according to the positional information of the second number of reference central points.

Optionally, the determination module 12 is specifically configured for:

determining an offset of each of the second number of reference central points relative to the circle center of the first wafer according to the positional information of the second number of reference central points and the positional information of the circle center of the first wafer to obtain a second number of offsets; and determining the positional information of the point corresponding to the average of the second number of offsets as the positional information of the central point of the etch rate distribution map of the first wafer.

The apparatus according to the embodiment of the present application can execute the aforementioned method embodiments, and its specific implementation principle and technical effect can be seen in the aforementioned method embodiments, and therefore, will not be repeated here in the present embodiment.

Figure 8:
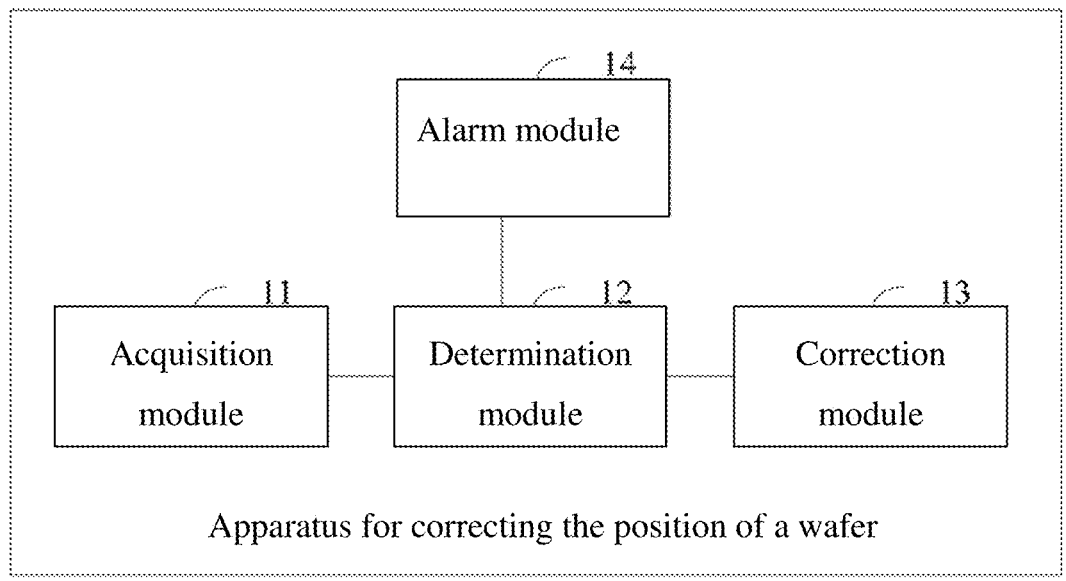
FIG. 8 is a schematic structural diagram of an apparatus for correcting the position of a wafer according to an embodiment of the present invention.

FIG. 8 is a schematic structural diagram of an apparatus for correcting the position of a wafer according to an embodiment of the present invention. As shown in FIG. 8, on the basis of the apparatus shown in FIG. 7, the apparatus according to the present embodiment may further include an alarm module 14, which is configured for: determining the average of the second number of offsets is within a second preset range; and sending alarm information if the average of the second number of offsets is not within the second preset range.

Optionally, the determination module 12 is specifically configured for:

determining a third number of reference central points with the radii of the circles where the third number of reference central points is located within a third preset range and angles of the shifted wafer notch point within a fourth preset range among the second number of reference central points according to the positional information of the second number of reference central points; and determining the positional information of the central point of the etch rate distribution map of the first wafer.

Optionally, the acquisition module 11 is configured for: acquiring etching parameters of preset points on an etched first wafer from a plasma etcher according to a preset cycle.

The apparatus according to the embodiment of the present application can execute the aforementioned method embodiments, and its specific implementation principle and technical effect can be seen in the aforementioned method embodiments, and therefore, will not be repeated here in the present embodiment.

Figure 9:
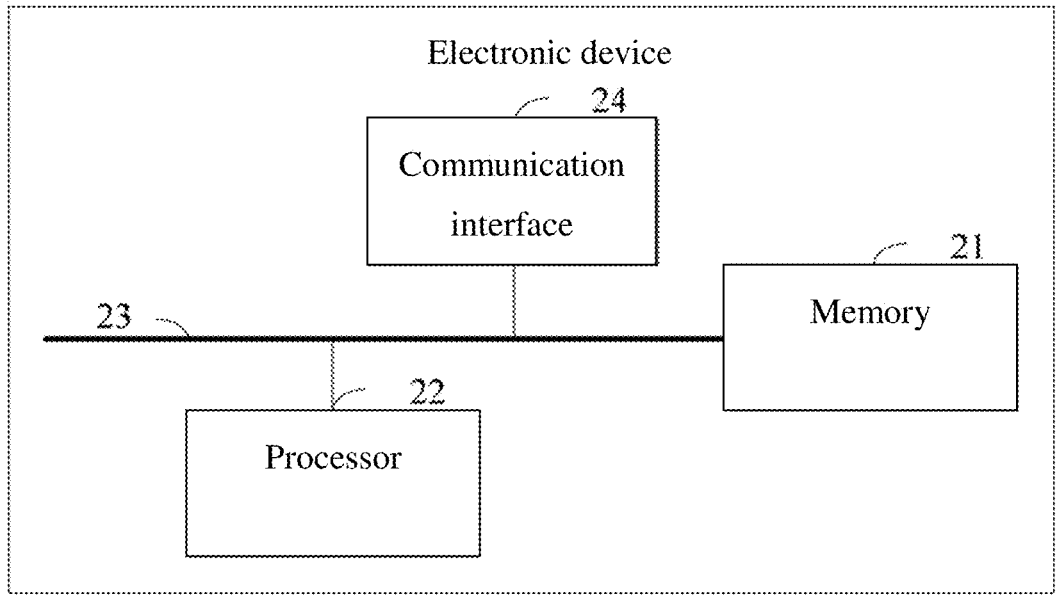
FIG. 9 is a schematic diagram of the hardware structure of an electronic device according to the present application.

FIG. 9 is a schematic diagram of the hardware structure of an electronic device according to the present application. As shown in FIG. 9, the electronic device according to the present embodiment may include: a memory 21 and a processor 22;

the memory 21 is configured for storing a computer program; and the processor 22 is configured for executing the computer program stored in the memory in order to implement the method for correcting the position of a wafer in the aforementioned embodiments. For details, please refer to the related description in the aforementioned method embodiments.

Optionally, the memory 21 may be independent of or integrated with the processor 22.

If the memory 21 is a device independent of the processor 22, the electronic device may further include:

a bus 23 configured for connecting the memory 21 and the processor 22.

Optionally, the electronic device according to the present embodiment may further include a communication interface 24, which may be connected with the processor 22 through the bus 23. The processor 22 can control the communication interface 24 to carry out the aforementioned acquisition function of the electronic device.

The electronic device according to the present embodiment can be used to execute the aforementioned method for correcting the position of a wafer, and its implementation and technical effect are similar, and therefore, will not be repeated here in the present embodiment.

The present application further provides a computer-readable storage medium in which a computer program is stored, and when the computer program is executed by a processor, the method for correcting the position of a wafer in the above embodiments is carried out.

In several embodiments according to the present application, it should be understood that the disclosed device and method can be implemented in other ways. For example, the aforementioned device embodiments are merely schematic. For example, the division of the modules is merely a logic function division. In practical implementation, there may be other division modes, for example, multiple modules may be combined or integrated into another system, or some features may be ignored or not executed. On the other hand, mutual coupling or direct coupling or communication connection shown or discussed may be indirect coupling or communication connection through some interfaces, apparatuses or modules, or may be in electrical, mechanical or other forms.

The modules described as separated components may or may not be physically separated, and the components displayed as modules may or may not be physical units, that is, they may be located at one place or distributed to multiple network units. Some or all of the modules may be selected according to actual needs to achieve the objective of the solution of the present embodiment.

In addition, each functional module in each embodiment of the present application may be integrated in one processing module, or each module may physically exist alone, or two or more modules may be integrated in one unit. The aforementioned unit integrated with the modules may be implemented in the form of hardware or in the form of a functional hardware+software unit.

The aforementioned integrated modules implemented in the form of functional software modules may be stored in a computer-readable storage medium. The aforementioned functional software modules are stored in a storage medium, and include a plurality of instructions to make a computer device (e.g. a personal computer, a server or a network device) or a processor execute part of the steps of the method of each embodiment of the present application.

It should be understood that the aforementioned processor may be a central processing unit (CPU) or other general-purpose processors, digital signal processors (DSP), application specific integrated circuits (ASIC), etc. A general-purpose processor may be a microprocessor or any conventional processors. The steps of the method disclosed in combination with the present invention may be directly embodied as being executed by the hardware processor or the combination of the hardware and software modules in the processor.

The memory may include a high-speed RAM memory, and may also include a nonvolatile memory NVM, such as at least one disk storage, or may also be a USB flash disk, a mobile hard disk, a read-only memory, a magnetic disk, a compact disk or the like.

The bus may be an industry standard architecture (ISA) bus, a peripheral component interconnect (PCI) bus, an extended industry standard architecture (EISA) bus or the like. The bus may be divided into an address bus, a data bus, a control bus, etc. In order to facilitate presentation, the bus in the accompanying drawing of the present application is not limited to only one bus or only one type of bus.

The aforementioned computer-readable storage medium may be implemented by any type of volatile or nonvolatile storage device or a combination therefore, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or a compact disk. The storage medium may be any available medium that can be accessed by a general-purpose or special-purpose computer.

The present application further provides a computer program, including program codes, and when the computer program is run by a computer, the program codes execute the steps of the method of any aforementioned method embodiment.

The present application further provides a computer program product, including a computer program, and when the computer program is executed by a processor, the steps of the method of any aforementioned method embodiment are carried out.

Finally, it should be noted that each embodiment above is merely intended to illustrate rather than limit the technical solution of the present application; although the present application has been described in detail with reference to the aforementioned embodiments, those of ordinary skill in the art should understand that the technical solution recorded in each aforementioned embodiment can still be modified or part or all of the technical features can be equivalently substituted; however, these modifications or substitutions are not intended to make the essence of the corresponding technical solutions depart from the scope of the technical solution of each embodiment of the present application.

What is claimed is:

1. A method for correcting a position of a wafer, executed by a processor, wherein the method comprising:
    acquiring etching parameters of preset points on an etched first wafer from a plasma etcher, the etching parameters comprising positional information and an etch rate, wherein the etched first wafer is performed etching by the plasma etcher, the plasma etcher is provided with a manipulator which is configured for transferring a wafer into a reaction chamber of the plasma etcher for etching and transferring the wafer out of the reaction chamber after etching is complete;
    determining the positional information of a central point of an etch rate distribution map of the first wafer according to the etching parameters of the preset points; and
    controlling the manipulator to correct the position of a second wafer to be etched according to the positional information of the central point of the etch rate distribution map of the first wafer, so that a circle center of the second wafer coincides with the central point of the etch rate distribution map of the first wafer.

2. The method according to claim 1, wherein the preset points comprise a first number of points on each of at least two circles, with a center of each circle being the circle center of the first wafer, radii of the circles being different and less than or equal to a radius of the first wafer and the first number of points on each circle being evenly distributed.

3. The method according to claim 2, wherein a difference between the radius of each of the at least two circles and the radius of the first wafer is less than or equal to a first threshold.

4. The method according to claim 2, wherein the determining the positional information of a central point of an etch rate distribution map of the first wafer according to the etching parameters of the preset points comprises:
    determining a second number of central positioning point groups with etch rate differences within a first preset range according to the etching parameters of the preset points, each central positioning point group comprising three preset points, and corresponding to a positioning triangle, and the second number being a positive integer;
    determining the positional information of each reference central point according to the positional information of the three preset points comprised in each central positioning point group to obtain the positional information of a second number of reference central points, wherein each reference central point is an excenter of the positioning triangle corresponding to each central positioning point group; and
    determining the positional information of the central point of the etch rate distribution map of the first wafer according to the positional information of the second number of reference central points.

5. The method according to claim 4, wherein the determining the positional information of a central point of the etch rate distribution map of the first wafer according to the positional information of the second number of reference central points comprises:
    determining an offset of each of the second number of reference central points relative to the circle center of the first wafer according to the positional information of the second number of reference central points and the positional information of the circle center of the first wafer to obtain a second number of offsets; and
    determining the positional information of a point corresponding to an average of the second number of offsets as the positional information of the central point of the etch rate distribution map of the first wafer.

6. The method according to claim 5, wherein the method further comprises:
    determining the average of the second number of offsets is within a second preset range; and
    sending alarm information if the average of the second number of offsets is not within the second preset range.

7. The method according to claim 4, wherein the determining the positional information of the central point of the etch rate distribution map of the first wafer according to the positional information of the second number of reference central points comprises:
    determining a third number of reference central points with the radii of the circles where the third number of reference central points is located within a third preset range and angles of a shifted wafer notch point within a fourth preset range among the second number of reference central points according to the positional information of the second number of reference central points; and
    determining the positional information of the central point of the etch rate distribution map of the first wafer according to the positional information of the third number of reference central points.

8. The method according to claim 1, wherein the positional information comprises two-dimensional coordinates, or a radius of a circle where the preset points are located and an angle of a shifted wafer notch point.

9. The method according to claim 8, wherein the determining the positional information of a central point of an etch rate distribution map of the first wafer according to the etching parameters of the preset points comprises:

determining a second number of central positioning point groups with etch rate differences within a first preset range according to the etching parameters of the preset points, each central positioning point group comprising three preset points, and corresponding to a positioning triangle, and the second number being a positive integer;

determining the positional information of each reference central point according to the positional information of the three preset points comprised in each central positioning point group to obtain the positional information of a second number of reference central points, wherein each reference central point is an excenter of the positioning triangle corresponding to each central positioning point group; and determining the positional information of the central point of the etch rate distribution map of the first wafer according to the positional information of the second number of reference central points.

10. The method according to claim 9, wherein the determining the positional information of a central point of the etch rate distribution map of the first wafer according to the positional information of the second number of reference central points comprises:

determining an offset of each of the second number of reference central points relative to the circle center of the first wafer according to the positional information of the second number of reference central points and the positional information of the circle center of the first wafer to obtain a second number of offsets; and determining the positional information of a point corresponding to an average of the second number of offsets as the positional information of the central point of the etch rate distribution map of the first wafer.

11. The method according to claim 1, wherein the determining the positional information of a central point of an etch rate distribution map of the first wafer according to the etching parameters of the preset points comprises:

determining a second number of central positioning point groups with etch rate differences within a first preset range according to the etching parameters of the preset points, each central positioning point group comprising three preset points, and corresponding to a positioning triangle, and the second number being a positive integer;

determining the positional information of each reference central point according to the positional information of the three preset points comprised in each central positioning point group to obtain the positional information of a second number of reference central points, wherein each reference central point is an excenter of the positioning triangle corresponding to each central positioning point group; and determining the positional information of the central point of the etch rate distribution map of the first wafer according to the positional information of the second number of reference central points.

12. The method according to claim 11, wherein the determining the positional information of a central point of the etch rate distribution map of the first wafer according to the positional information of the second number of reference central points comprises:

determining an offset of each of the second number of reference central points relative to the circle center of the first wafer according to the positional information of the second number of reference central points and the positional information of the circle center of the first wafer to obtain a second number of offsets; and determining the positional information of a point corresponding to an average of the second number of offsets as the positional information of the central point of the etch rate distribution map of the first wafer.

13. The method according to claim 12, wherein the method further comprises:

determining the average of the second number of offsets is within a second preset range; and sending alarm information if the average of the second number of offsets is not within the second preset range.

14. The method according to claim 11, wherein the determining the positional information of the central point of the etch rate distribution map of the first wafer according to the positional information of the second number of reference central points comprises:

determining a third number of reference central points with radii of circles where the third number of reference central points is located within a third preset range and angles of a shifted wafer notch point within a fourth preset range among the second number of reference central points according to the positional information of the second number of reference central points; and determining the positional information of the central point of the etch rate distribution map of the first wafer according to the positional information of the third number of reference central points.

15. The method according to claim 1, wherein the acquiring etching parameters of preset points on an etched first wafer comprises:

acquiring etching parameters of preset points on an etched first wafer from a plasma etcher according to a preset cycle.

16. A computer-readable storage medium, storing a computer program, wherein when the computer program is executed by a processor, the steps of the method according to claim 1 is carried out.

17. An electronic device, comprising a non-transitory computer-readable medium memory, a processor and a computer program stored in the non-transitory computer-readable medium memory and capable of running in the processor, wherein when the computer program is executed by the processor, the steps of the method according to claim 1 is carried out.

18. A computer program product, comprising a computer program stored in a non-transitory computer-readable medium, wherein when the computer program is executed by a processor, the steps of the method according to claim 1 are carried out.

* * * * *